US010586833B2

(12) United States Patent
Large

(10) Patent No.: US 10,586,833 B2
(45) Date of Patent: Mar. 10, 2020

(54) OLED DISPLAY COLOR COMPENSATION

(71) Applicant: Microsoft Technology Licensing, LLC, Redmond, WA (US)

(72) Inventor: Timothy Large, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/975,527

(22) Filed: May 9, 2018

(65) Prior Publication Data
US 2019/0348469 A1 Nov. 14, 2019

(51) Int. Cl.
*H01L 27/32* (2006.01)
*G02B 5/30* (2006.01)
*H01L 51/52* (2006.01)
*G09G 3/3258* (2016.01)
*G06F 3/041* (2006.01)

(52) U.S. Cl.
CPC .......... *H01L 27/322* (2013.01); *G02B 5/3025* (2013.01); *G06F 3/0412* (2013.01); *G09G 3/3258* (2013.01); *H01L 27/323* (2013.01); *H01L 27/3262* (2013.01); *G09G 2320/0242* (2013.01); *H01L 51/5234* (2013.01); *H01L 51/5262* (2013.01)

(58) Field of Classification Search
CPC ............. H01L 27/3211; H01L 51/5234; H01L 27/3281; H01L 51/5262; H01L 51/5265; H01L 51/5215; H01L 33/465
USPC ...................... 257/40, 72, 89; 438/48, 82, 99
See application file for complete search history.

(56) References Cited

U.S. PATENT DOCUMENTS

| | | | |
|---|---|---|---|
| 5,930,011 A | 7/1999 | Gambogi, Jr. et al. | |
| 5,949,188 A | 9/1999 | Leising et al. | |
| 7,212,345 B2 | 5/2007 | Wilson | |
| 7,309,956 B2 | 12/2007 | Raychaudhuri et al. | |
| 7,489,074 B2 | 2/2009 | Antoniadis et al. | |
| 8,704,979 B2 | 4/2014 | Park et al. | |
| 9,685,486 B2 | 6/2017 | Cheon et al. | |
| 2003/0214961 A1* | 5/2003 | Magno et al. ...... H01L 27/3211 | 359/196 |
| 2006/0066228 A1 | 3/2006 | Antoniadis et al. | |
| 2014/0036203 A1 | 2/2014 | Guillou et al. | |

(Continued)

FOREIGN PATENT DOCUMENTS

| | | |
|---|---|---|
| CN | 103928624 A | 7/2014 |
| JP | 2009252569 A | 10/2009 |

OTHER PUBLICATIONS

"International Search Report and Written Opinion Issued in PCT Application No. PCT/US19/029528", dated Aug. 7, 2019, 16 Pages.

*Primary Examiner* — Thinh T Nguyen
(74) *Attorney, Agent, or Firm* — Ray Quinney & Nebeker P.C.; John O. Carpenter

(57) ABSTRACT

A display includes a substrate, an array of organic light emitting diode (OLED) structures supported by the substrate, and a filter extending across the array of OLED structures. The filter is positioned relative to the array of OLED structures such that light emitted by each OLED structure of the array of OLED structures is directed toward the filter. The filter is configured to reflect a portion of the light having a respective wavelength and propagating at a respective off-axis angle back toward the array of OLED structures to reduce an amount of the light having the respective wavelength emitted by the display at the off-axis angle.

20 Claims, 4 Drawing Sheets

(56) References Cited

U.S. PATENT DOCUMENTS

| | | |
|---|---|---|
| 2015/0102328 A1 | 4/2015 | Shin et al. |
| 2015/0130896 A1* | 5/2015 | Ma et al. ............. G03H 1/0005 348/40 |
| 2016/0268554 A1* | 9/2016 | Wu et al. |
| 2018/0323242 A1 | 11/2018 | Drzaic |

* cited by examiner

OLED DISPLAY COLOR COMPENSATION

DESCRIPTION OF THE DRAWING FIGURES

For a more complete understanding of the disclosure, reference is made to the following detailed description and accompanying drawing figures, in which like reference numerals may be used to identify like elements in the figures.

Figure 1:
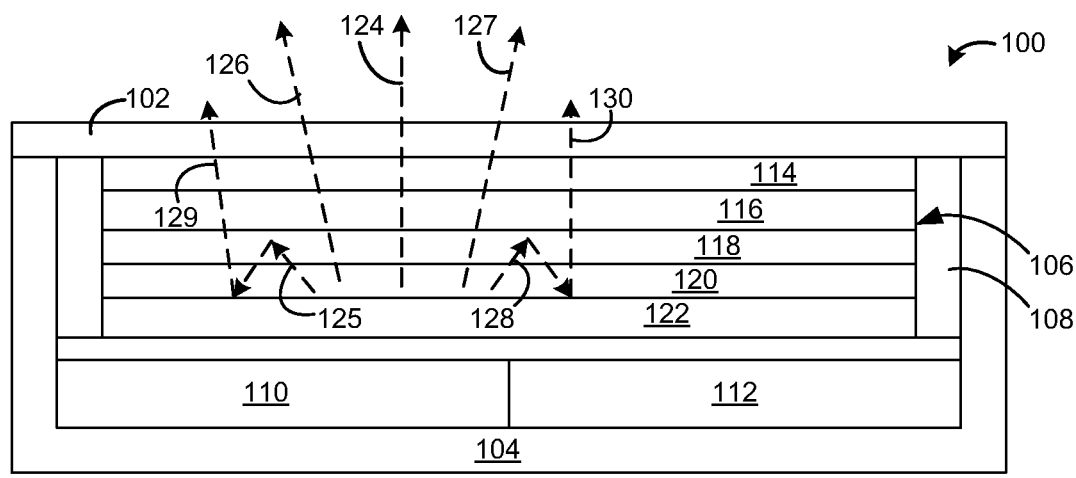
FIG. 1 is a partial, schematic, cross-sectional view of an electronic device having an organic light emitting diode (OLED) display with color compensation in accordance with one example.

The disclosed devices and displays may assume various forms. Specific examples are illustrated in the drawing (and are hereafter described) with the understanding that the disclosure is intended to be illustrative, and is not intended to limit the invention to the specific examples described and illustrated herein.

DETAILED DESCRIPTION

Organic light emitting diode (OLED) displays exhibit poor off-axis color performance relative to other types of displays, such as in-plane switching liquid crystal displays. OLED displays exhibit a color shift with increasing off-axis angle. To a viewer of an OLED display, the color shifts from a pinkish hue when viewed on-axis to a blue-green color when viewed off-axis. The off-axis color shift may arise from efforts to increase on-axis luminance via optical gain provided by the cavity strength of each pixel of the OLED display. For instance, the color shift may be produced by an interference effect arising from alternating encapsulation layers of the OLED displays and/or other display layers, such as electrode and hole injection layers. The Bragg grating may cause the luminous intensity for red wavelengths to drop faster than for blue and green wavelengths, thereby resulting in a relative increase in blue and green light at off-axis angles.

Displays having a filter to correct or otherwise compensate for the color shift are described. The filter is a wavelength-selective, reflective filter. The filter is configured to reflect light of a certain wavelength (e.g., blue light) and propagating at a respective off-axis angle (e.g., about 20 to about 30 degrees) back toward an array of OLED structures of the display. The amount of light of the certain wavelength emitted by the display at the off-axis angle is thus reduced.

The filter may reflect off-axis light of one or more wavelengths. For example, the filter may reflect off-axis light for wavelengths falling within a blue band, such as at or near a blue peak at about 460 nm and/or for off-axis light for wavelengths falling within a green band, such as at or near a green peak of about 530 nm. The bandwidth, the center wavelength, and other aspects of the reflected band may vary from the examples described herein.

The reflection of the off-axis light allows the reflected light to be recycled within the OLED display. The off-axis light is reflected by the filter back toward the OLED structures (e.g., back into the OLED display). The reflection approach uses the non-flat nature of the OLED structures of the display. The reflected light may thus be eventually emitted from the display at other angles, e.g., on-axis.

The filter may be or include an interference filter. For example, the filter may include one or more Bragg gratings. Each Bragg grating may be a thick Bragg grating. For instance, the Bragg grating may have a thickness greater than several multiples of the wavelength being reflected.

The filter may include a Bragg grating oriented in parallel with the display. For instance, the Bragg grating may be coplanar with one or more display layers. The light reflected by the Bragg grating may thus be redirected back at the display, as if from a planar mirror. The redirection is the same for all light of the respective wavelength and emission angle, regardless of azimuth direction.

Multiple parameters of the filters may be customized or tuned by adjusting one or more characteristics of the grating(s). For example, the strength of the filter is modulated by the index difference of the grating. The bandwidth of the filter is modulated by the depth of the grating.

The filter may be or include a film. In some cases, the film may be or include a holographic film. The film may be discrete or otherwise separate from or external to the OLED display. In other cases, the filter may be an internal or otherwise integrated component of the OLED display. For example, the filter may be or include a layer disposed within an encapsulation or other barrier layer of the OLED display. The extent to, or manner in, which the filter is integrated with the other components of the display may vary. A separate film may be useful to avoid OLED fabrication challenges that may arise with integration. On the other hand, integration may be useful to dispose the filter closer to the OLED structures to avoid any losses in resolution.

The color compensation may be achieved without introducing optical losses (or with minimal optical losses). An ideal Bragg grating provides wavelength and angular selectivity with zero optical loss. In practice, a small amount of on-axis light may be reflected. But the displays may compensate for, if not reverse, any such losses through the recycling of the reflected light. Any reflected light may be again reflected by, for instance, diffusing elements in the OLED display. The light is thus given another chance to be incident upon the grating in a different direction. The recycled light may eventually be directed outward from the OLED display sufficiently on-axis to pass through the filter.

Significant on-axis losses are also avoided because the filter is configured to suppress or block on-axis light at wavelengths not relied upon by the display. The reflection characteristic of the Bragg grating is a function of both incidence angle and wavelength. To avoid undesirable reflection, the wavelength(s) reflected by the filter for on-axis light (or other narrow-angled light) may fall between the wavelengths emitted by the display. For example, on-axis light having a wavelength between the primary red, green and blue wavelengths produced by the display may be reflected without adversely impacting the on-axis luminance of the display.

The color compensation may be achieved without other adverse optical effects. For instance, any losses in resolution may be imperceptible to the viewer or otherwise insignificant. Human vision in the blue band has poor resolution. The color compensation is also achieved without introducing ringing effects at off-axis angles or creating Moiré pattern effects.

The displays may be useful in devices having multiple display screens or curved display screens. Images rendered on the multiple screens (or displays) may appear to be inconsistent if the screens are oriented at different angles relative to the viewer. The different angles may arise from oriented the screens at an angle relative to one another. The filter of the disclosed displays allows the color to appear consistent across all screens or displays. Different angles may also arise with curved screens or displays. The filter of the disclosed displays allows the color to appear consistent from one edge of the curved display to the other edge.

The displays are useful with a wide variety of devices. The size and form factor of the device may vary considerably. Devices may range from wearable or handheld devices and other mobile devices to still other portable or non-portable devices having an OLED display. The composition and other characteristics of the other components of the display module and the electronic device may vary accordingly. For instance, the color compensation filter is useful in cases in which the OLED display has pixel cavities to increase luminance in an efficient manner. Nevertheless, the color compensation filter may be used in connection with other types of OLED devices. For example, the OLED display may not include pixel cavities.

FIG. 1 is a cross-sectional view of an electronic device 100 having a transparent cover 102, a shell 104, and a display 106 (e.g., a display module) disposed between the transparent cover 102 and the shell 104. The display module 106 includes a number of constituent films or other components. The films may be arranged in a stack under the transparent cover 102 as shown. In this example, the constituent films of the display module 106 are carried or otherwise supported by an internal frame 108. In some cases, the internal frame 108 is positioned along a periphery of the films, e.g., along an inner surface of the shell 104. The positioning of the internal frame 108 and, accordingly, the constituent films of the display module 106 may vary.

In the example of FIG. 1, the electronic device 100 includes a battery 110 and an electronics module 112. The battery 110 and the electronics module 112 may be mounted within the shell 104 in various ways. For ease in illustration, the battery 110 and the electronics module 112 are depicted in FIG. 1 as supported by a bottom panel of the shell 104. In other cases, one or both of the battery 110 and the electronics module 112 may be mounted on a circuit board and/or other internal support. The device 100 may include additional, fewer or alternative components. For instance, the device 100 may include an antenna for wireless communications.

The transparent cover 102 may include or be composed of glass, plastic, and/or other transparent materials. The transparent cover 102 may thus be referred to as a cover glass. In some cases, one or more components of the display module 106 may be affixed to, or otherwise carried by, the transparent cover 102. For example, touch sensor elements may be applied to the transparent cover 102. The transparent cover 102 may be integrated with the display module 106 in some cases. For instance, the transparent cover 102 may include and/or be configured as a circular polarizer. Alternative or additional optical elements may be provided via the transparent cover 102.

The display module 106 may be configured as a stack of layers, films, or other components. The display module stack 106 may include any number of optical layers or films. Any number of the layers of the display module 106 may be structurally supported by the internal frame 108. In this example, the display module 106 includes a touch sensor unit 114, a circular polarizer unit 116, a color compensation filter 118, an OLED display panel 120, and a back panel 122. Each unit or other element 114, 116, 118, 120, 122 of the display module 106 is schematically depicted in FIG. 1 as a single layer for ease in illustration. Each unit or element 114, 116, 118, 120, 122 may be a composite structure or layer including any number of constituent films and/or other components. For instance, each unit or element 114, 116, 118, 120, 122 may include one or more substrates on which functional layers or other elements are formed or otherwise disposed.

The touch sensor unit 114 may be or include a capacitive touch sensor system. The touch sensor unit 114 may be disposed in an on-cell touch sensor arrangement. The touch sensor unit 114 may be integrated with the transparent cover and/or the circular polarizer unit 116. Other arrangements or types of touch sensors may be used. For instance, the touch sensor 114 may be disposed in an in-cell touch sensor arrangement. Additional or alternative touch technologies may be used, including, for instance, resistive or acoustic touch sensor systems.

The circular polarizer unit 116 may include multiple layers or films, including, for instance, a quarter-wave plate and a polarizing filter. One or more layers or elements of the circular polarizer unit 116 may be integrated with the transparent cover 102. For instance, the polarizing filter may be or include a hard coating (e.g., powdered or nano-scale glass in a polymer binder) disposed on the transparent cover 102.

The OLED panel 120 may include an array of OLED structures. The array of OLED structures are arranged to establish pixels of the display module 106. The pattern or arrangement of the pixels and/or sub-pixels may vary. The color compensation techniques described herein are well suited for use with various pixel and sub-pixel arrangements. In one example, a pentile sub-pixel arrangement is used. Alternatively or additionally, diamond or other pixel arrangements may be used.

The OLED panel 120 may be a composite structure or layer. The OLED panel 120 may use the back panel 122 as a substrate. Any number and various types of optical films may be included in the OLED panel 120. The OLED panel may include one or more arrays of OLED structures. Further details regarding the OLED panel 120 are provided in connection with the examples shown in FIGS. 2 and 3.

The display module 106 may include any number of adhesive films or other intermediary layers disposed between or within the units, films, or panels shown. In some cases, various types of optically clear adhesives are used. The adhesive films or other layers are not shown for ease in depiction of the other layers or elements of the display module 106.

Additional, fewer, or alternative layers may be included. For example, the display module 106 may include one or more stress relief layers and/or one or more thermal normalization layers. The order of these and other units, films or other elements of the display module 106 may vary. For instance, any stress relief or thermal normalization layers may be disposed inward or outward of the circular polarizer unit 116 and/or the color compensation filter film 118.

Some of the components of the display module 106 may be integrated with one another. For example, a constituent component of one of the units 114, 116, 118, 120, 122 may be formed on or in, or be otherwise integrated with a constituent component of another one of the units 114, 116, 118, 120, 122. For example, the touch sensor unit 114 may include one or more components or layers formed on, applied to, or otherwise secured to the circular polarizer 116. The display module 106 may include fewer, additional, or alternative components. For instance, the display module 106 may rely on a bottom of the shell 108 to act as the back panel 122.

The filter 118 is configured to provide color correction or other compensation for the OLED panel 120. The filter 118 extends across the OLED panel 120, or any OLED structures thereof. The filter 118 is positioned relative to the OLED panel 120, or any OLED structures thereof, such that light emitted by the OLED panel 120, or each OLED structure thereof, is directed toward the filter 120. For instance, the filter 118 may be positioned forward of, or above, the OLED panel 120. The filter 118 may thus be illuminated by the light emitted by the OLED panel 120.

The light emitted from the OLED panel is schematically depicted in FIG. 1 by a number of example rays 124-128. The ray 124 is emitted perpendicularly from the OLED panel 120, along a normal of the display module 106. The ray 126 is considered to be on-axis. The other rays 125-128 are offset from the display normal, and are accordingly considered to be off-axis. The off-axis angle of each ray 125-128 is measured relative to the display normal.

The filter 118 is both wavelength-selective and angle-selective. The filter 118 is configured to reflect a portion of the light emitted by the OLED panel 120 propagating at a certain off-axis angle. In the example of FIG. 1, the filter 118 may be configured to reflect a portion of the light 124-128 back toward the OLED panel 120 or OLED structure thereof. The filter 118 selects the respective wavelength and the respective off-axis to be reflected. Light not having the respective combination of wavelength and off-axis angle is allowed to pass through, e.g., to reach a viewer. In this example, the rays 125, 128 correspond with the portion of the light reflected. The rays 125, 128 thus have a wavelength (e.g., blue light) and off-axis angle (e.g., about 30 degrees) that the filter 118 is configured to reflect. Such reflection reduces the amount of the light having the respective wavelength emitted by the display module 106 at the respective off-axis angle.

The reflected light is directed back toward the OLED panel 120. The reflected light may be recycled. In the example of FIG. 1, the light rays 125, 128 are directed back toward the OLED panel 120. Upon reaching the OLED panel 120, the light rays 125, 128 may be reflected again by a layer or element of the OLED panel 120. For instance, the OLED panel 120 may include a bottom or lower reflective layer, such as a reflective electrode. Alternatively or additionally, the light reflects off another layer or component of the display module 106, such as the back panel 122. In the example of FIG. 1, the light rays 125, 128 are reflected to form light rays 129, 130, respectively. The light rays 129, 130 are thus directed forward, or toward the viewer. The light then encounters the filter 118, at which point the light is either reflected backward again, or allowed to pass through. Eventually, the light may be directed on-axis along or near the surface normal. The reflected light may thus increase the on-axis luminance of the display.

The light rays 129, 130 may be oriented at an off-axis angle different than the off-axis of the original light rays 125, 128. The OLED panel 120 is non-flat, despite appearing to be flat or planar when viewed at the scale shown in FIG. 1. Various features of the OLED panel 120 may thus scatter the light rays 129, 130 at various off-axis angles. Some, if not most, of those off-axis angles do not correspond with the respective off-axis angle(s) addressed by the filter 118. The light rays 129, 130 may thus pass through the filter 118 as a result. For these reasons, the filter 118 reduces the amount of the light having the respective wavelength at the respective off-axis angle despite the recycling.

The filter 118 may be or include an interference grating configured to reflect—e.g., through an interference effect—the portion of the light having the respective wavelength and propagating at the respective off-axis angle. The interference grating may include modest modulation in refractive index to effect the reflection. For instance, the refractive index may vary between about 0.005 and about 0.05, but a wide variety of other refractive indices (and refractive index differences) may be used. The interference grating may be a deep grating. In some cases, the refractive index modulation of the interference grating is periodic. The filter 118 may accordingly be or include a Bragg grating. The Bragg grating or other interference grating of the filter 118 correlates the respective wavelength and the respective angle with one another. The filter 118 reflects a respective wavelength at each respective off-axis angle. In one example, the filter 118 reflects blue light at about 460 nm propagating at an off-axis angle of about 25 degrees.

Additional or alternative wavelengths and off-axis angle combinations may be reflected. For example, the respective wavelength may be within a band of wavelengths (e.g., about 450 nm to about 470 nm) that the filter 118 is configured to reflect, thereby establishing a bandwidth of the filter 118. Each wavelength in the band has a corresponding off-axis angle within a range of off-axis angles (e.g., about 20 degrees to about 30 degrees). Other wavelength-angle combinations may be reflected by an additional Bragg grating or other interference grating of the filter 118. Further details regarding the wavelength-angle combination(s) are provided in connection with the examples of FIGS. 4-8. The filter 118 may include any number of Bragg gratings.

The filter 118 may include or be provided as a film, e.g., a filter film. In the example of FIG. 1, the filter 118 is a film separate or discrete from the OLED panel 120. For instance, the film is external to a moisture and oxygen barrier of the OLED panel 120. The film may accordingly be considered external to the OLED panel 120. In the example of FIG. 1, the film of the filter 118 is contiguous with the OLED panel 120. The filter 118 may be adjacent to the OLED panel 120 in other ways. For instance, the filter 118 and the OLED panel 120 may be adhered to one another by an optically clear adhesive layer.

Each Bragg or other interference grating of the filter 118 includes a series of grating structures (e.g., holographic structures) written into the film(s) of the filter 118. Each grating structure presents or includes a variation in refractive index. Collectively, the grating structures thus present a repetitive series of planes of high and low refractive index (or other index variation) in one direction. The bandwidth and efficiency of the holographic structure is determined by the amount of (e.g., maximum) change in refractive index and the collective depth or thickness of the set of structures. The planes of each Bragg grating may be oriented in a plane parallel with the plane of the display panel, or orthogonal to the display normal. In such cases, the Bragg grating structures may thus be considered to be co-planar with the display. In other cases, the Bragg grating structures are oriented at an angle offset from the display plane. Multiple co-planar gratings may be included. In some cases, the gratings are overlapping, e.g., overlaid upon one another within the same film.

The filter 118 may be written in, or include, a photopolymer film, such as bleached silver halide, one of the Holographic Recording Films (HRF) available from DuPont, or the Bayfol HX film available from Covestro. The photopolymer films, such as Bayfol HX, have sufficient modulation capability to record multiple high efficiency holograms. Other types of photo-sensitive films may be used. Alternatively, the filter 118 may be formed directly in a liquid crystal/polymer matrix by selective polymerization. An example of such a process is the polymer-liquid crystal-polymer slice (POLYCRIPS) structure and process developed at the University of Calabria in Italy, in which each Bragg grating structure is formed from alternating polymer and liquid crystal layers by direct exposure to a laser source. The filter 118 may be recorded or otherwise formed in still other ways, including, for instance, ways that do not form the filter 118 holographically. For example, the filter 118 may be formed via a sputtering process.

Each series of grating structures is highly reflective in an angular-selective and wavelength-selective manner. The performance of such structures are given by Kogelnik's equations or, more generally, by a reduced form Maxwell's equations. Each series reflects off-axis light back toward the OLED panel 120 when light is incident upon the set at an angle such that the spacing between the refractive index variations is one half of the wavelength of the incident light. Each series of grating structures is configured to reflect a particular bandwidth of light (the reflected bandwidth) over a particular range of angles. The grating structures are configured such that the reflected bandwidth falls on a particular display color (e.g., blue or green) to be reduced at off-axis angle(s). The luminance at the particular display color is accordingly reduced because the color is rejected by the grating structures. The rejected light is then recycled and emitted over a range of angles.

Light in the reflected bandwidth travelling along the display normal (e.g., the on-axis light ray 124 or other ray normal to the surface of the filter 118) is not affected. Instead, the grating structures are tuned or configured such that the wavelengths that are reflected by the grating structures for light travelling along the display normal are not relevant to the display. As a result, on-axis luminance is not adversely affected, including light at the respective wavelength reflected at the respective off-axis angle. For example, light at the respective wavelength (e.g., 460 nm) propagating on-axis or at other angles (e.g., 0-20 degrees, 30-70 degrees) is not reflected by the interference grating of the filter 118. Further, light at other wavelengths (e.g., green or red light) propagating at the respective off-axis angle (e.g., 25 degrees) is also not reflected by the interference grating of the filter 118. The interference grating of the filter 118 is also configured such that light at the emission bands (e.g., green, red, and blue) of the OLED panel 120 is not reflected when propagating on-axis or other off-axis angles. Further details regarding such filter tuning are described below in connection with FIGS. 7 and 8.

The filter 118 may include multiple interference gratings, e.g., Bragg gratings, to address light offset from the display normal in different azimuth directions. The directions may be up, down, left, and right, for example. A single set of Bragg gratings may provide such reflectivity for light angled from the surface normal in one direction. Each Bragg grating may thus be configured to address a respective direction. For example, a first Bragg grating reflects light propagating at about 30 degrees from the surface normal toward the left side of the display, such as the light ray 125 in the example of FIG. 1. A second Bragg grating may then be added to the filter 118 to reflect light propagating toward the right side of the display, such as the light ray 128 in the example of FIG. 1. Thus, any number of multiple Bragg gratings may be included in the filter 118 to provide reflective behavior in multiple directions. For instance, a further pair of Bragg gratings may be written in the orthogonal direction, as described below in connection with the example of FIG. 5. The Bragg gratings may be written in the same film or multiple films.

When extended to multiple (e.g., three) dimensions, the Bragg grating sets may exhibit a periodic structure, or lattice. If the planes of the grating structures represent areas of high refractive index, then the resulting intersections of four planes form a photonic lattice. The filter 120 may thus be considered a photonic lattice filter. In one case, the structure includes the intersection of four sets of grating structures. Two sets are configured to reflect light propagating off-axis to the left and right sides of the display (e.g., +/−30 degrees left-right). The other two sets are configured to reflect light propagating to the top (upper) and bottom (lower) sides of the display (e.g., +/−30 degrees up-down). In other cases, only two sets of planes may be included for reflections of off-axis light propagating in, for instance, the left-right directions.

Additional or alternative off-axis angles may be addressed. In some cases, the additional off-axis angles are addressed to reflect a range (or a wider range) of angles and/or a band (or a wider band) of wavelengths.

The spacing may vary within a respective Bragg grating. For instance, one or more of the Bragg grating sets may be configured as a chirped grating set. In such cases, the spacing between adjacent grating structures varies across the set so that the range of wavelengths, or bandwidth, reflected by the set is broadened. Additional or alternative options for broadening the bandwidth may also be used, including, for instance, using source light of a desired bandwidth to write the Bragg grating.

Adjacent units, layers or other elements or components of the display module 106 may be bonded together or otherwise secured to one another. For example, the touch sensor unit 114 may be bonded to the circular polarizer unit 116. The circular polarizer unit 116, may, in turn, may be bonded to the filter 118. The adhesive layers are not shown for ease in illustration. Optically clear adhesive may be used. The display module 106 may also be bonded or otherwise secured to the transparent cover 102. In some cases, adjacent layers or films are not bonded or secured to one another. Adjacent units or panels of the display module 106 may thus be contiguous or in contact with one another—e.g., without an adhesive layer therebetween.

The electronic device 100 may include fewer, additional, or alternative display-related components. For example, in some cases, one or more components of the display module 106 may also serve as the transparent cover 102. For instance, rather than having a separate, additional cover, one of the layers or components of the display module may be used as an external display layer. For example, the external display layer may be or include a linear polarizer of the circular polarizer 116. The linear polarizer may include a hard coating (e.g., powdered or nano-scale glass in a polymer binder) for protection during use. Alternatively or additionally, a touch sensor layer may be formed upon or added to one of the other layers in an in-cell touch sensor arrangement. Other touch display arrangements may be used.

The construction and configuration of the device 100 may vary from the example shown in FIG. 1. For instance, the transparent cover 102 may be integrated with one or more components of display module 106. The display module 106 itself may also vary considerably. For example, the display module 106 may or may not be configured as a touchscreen.

Figure 2:
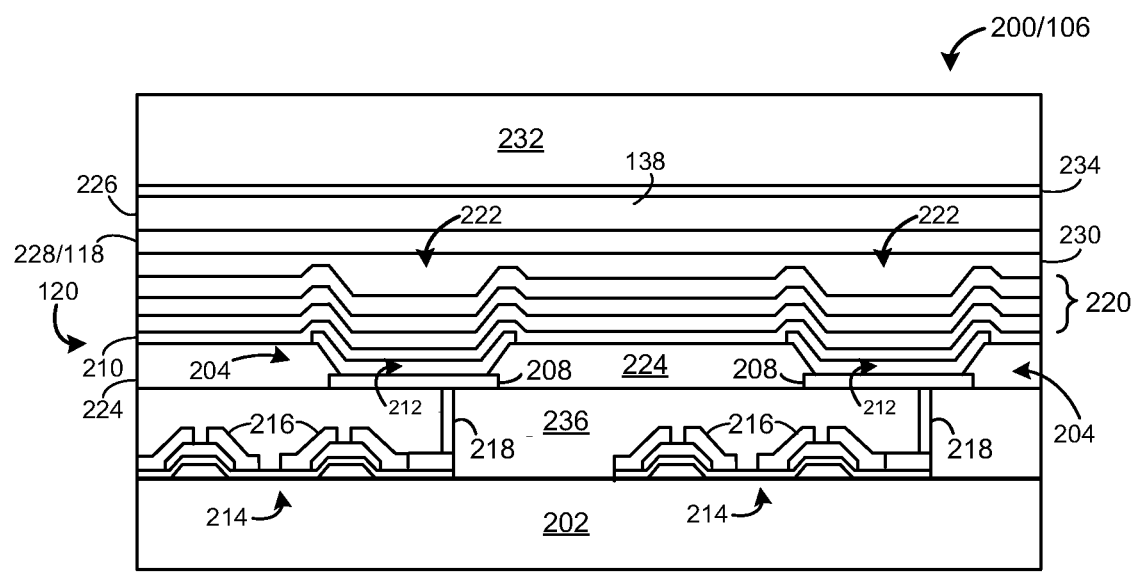
FIG. 2 is a partial, schematic, cross-sectional view of the OLED display of FIG. 1 to depict a color compensation filter of the OLED display in accordance with one example.

FIG. 2 shows a display 200 to depict the OLED panel 120 and other elements of the display module 106 of FIG. 1 in greater detail. The display 200 may be incorporated into any of the devices described herein. The display 200 may be considered an OLED display.

In the example of FIG. 2, the OLED panel 120 includes a backplane or other substrate 202 and an array of OLED structures 204 supported by the substrate 202. The substrate 202 may support any of layers and/or other elements and features of the OLED panel 120 described herein. The substrate 202 may be flexible. Exemplary materials for the substrate 202 include polyimide, flexible glass, flexible metal foil, polyethylene terephthalate ("PET"), polyethylene naphthalate ("PEN"), poly(methyl methacrylate) (PMMA), polycarbonate, or any other flexible material. In some cases, the substrate 202 may correspond or be integrated with the back panel 122 (FIG. 1).

Each OLED structure 204 may form or provide or otherwise correspond with an OLED sub-pixel of the display 200. Each sub-pixel may be directed to providing a respective color for a respective pixel of the display module 106. In most cases, the respective colors include red, green, and blue. The arrangement, output distribution, and other characteristics of the sub-pixels may vary. For instance, other colors may be provided.

In the example of FIG. 2, each OLED structure 206 includes a lower electrode 208, an upper electrode 210, and an organic layer stack 212 disposed between the electrodes 208, 210. The upper electrode 210 is composed of a transparent or partially transparent conductive material. In this case, the upper electrode 210 is provided as a layer that extends across multiple OLED structures 204. The layer of the upper electrode 210 may or may not be patterned for selectively addressing a subset of the sub-pixels or pixels of the display 200. A respective one of the lower electrodes 208 may be provided for selectively addressing each sub-pixel or a respective group of sub-pixels. The layers of the OLED structure 204 are depicted in FIG. 2 in simplified form for ease in illustration. For instance, the layers may not be planar as shown, but may instead be conformal to varying extents to the underlying structures. Also, at least a portion of the layers may extend beyond the pixel walls or boundaries.

Each sub-pixel includes respective thin film transistor (TFT) circuitry 214. In this example, the TFT circuitry 214 includes a pair of transistors 216 disposed on the substrate 202. The TFT circuitry 214 controls the voltage applied to the lower electrode 208 of the sub-pixel. In this example, one of the transistors 216 is connected to the lower electrode 208 via an interconnect via 218. The electrical connections involving the TFT circuitry 214 are depicted schematically and in simplified form, and thus may vary considerably from the example shown.

The OLED panel 120 includes a number of encapsulation layers 220 that extend across the OLED structures 204. Each encapsulation layer 220 may conformably cover the OLED structures 204. The encapsulation layers 220 form a barrier that protects the OLED structures 204 from moisture, oxygen, and/or other contaminants, e.g., a water vapor transmission barrier. In some cases, the OLED panel 120 includes a multi-layer encapsulation framework in which multiple encapsulation layers 220 are arranged in a stack to provide redundancy.

In some cases, the encapsulation layers 220 may present alternating layers of inorganic and organic materials. For example, a lowest layer of the layers 220 may be or include an inorganic layer, such as silicon dioxide, silicon nitride, or silicon oxynitride. The next lowest encapsulation layer may then be or include an organic layer, such as cross-linkable polymeric layer including acrylates (e.g. polymethyl methacrylate, PMMA) or polyesters (e.g., polyethylene terephthalate, PET). Additional encapsulation layers 220 may be provided as one or more dyads, in which, for example, an organic layer and an inorganic layer are paired. As a result, an organic encapsulation layer may be sandwiched between an upper inorganic encapsulation layer and the inorganic material. The encapsulation layers 220 may include any number (e.g., seven) of dyads. Materials other than inorganic materials may be used.

The encapsulation layers 220 are not limited to multiple dyad arrangements. A variety of other stack arrangements may be used, including those that include non-paired numbers of encapsulation layers (inorganic and/or organic) and/or different types of materials and/or layers. For instance, one or more of the layers may be a composite layer in which organic material is suspended, embedded, or otherwise integrated within an inorganic material, or vice versa. In some cases, only a single encapsulation layer 220 is provided. Examples of single-layer solutions include inorganic or carbon-based (e.g., graphene platelets or nanoribbons) material in a polymeric binder. Alternatively, the single layer solution may be based on an inorganic polymer system. Such single layer solutions systems may or may not involve curing for polymerization, or cross-linking, via ultraviolet light, e-beam, or other methods.

The encapsulation layer(s) 220 may conform to, and cover, a well or cavity 222 of each OLED structure 204. The well 222 may be configured to increase the on-axis luminance and power efficiency of the display 200. The on-axis luminance may be increased via internal reflections within the well 222. The cavity strength of the well 222 leads to the wavelength dependence addressed by the filters described herein.

Each well 222 may be defined by openings or other features in one or more layers of the OLED panel 120. In this example, each well 222 arises from the patterning of a dielectric layer 224. The dielectric layer 224 may act as a field dielectric layer to define the active area for each OLED structure 204. The dielectric layer 224 may be composed of silicon dioxide, silicon nitride, and/or other dielectric materials.

The display 200 may include one or more optical component layers 226 that extend across the OLED structures 204. The optical component layers 226 are positioned relative to the OLED structures 204 such that light emitted by the OLED structures 204 illuminates or otherwise encounters the optical component layer(s) 226. In this example, the light may encounter the optical component layer(s) 226 after passing through the encapsulation layer(s) 220.

Each optical component layer 226 may be configured to implement or perform a respective optical function. The optical function achieves an intended optical result or operation, as opposed to layers that introduce an unintended or incidental effect. In the example of FIG. 2, the optical component layer(s) 226 may be configured to effectuate a respective optical function upon ambient light directed toward the OLED structures 204. In OLED cases, the optical component layer(s) 226 may collectively form a circular polarizer. In such cases, one optical component layer 226 is a quarter wave plate, such that the function of the optical component layer 226 is a quarter-wave retarder. To complete the circular polarizer for ambient light incident upon the display 100, another optical component layer 226 is configured to act as a linear polarizer. The ambient light is thus circularly polarized by the optical component layers 226 before reflection off of an internal layer or structure, such as the lower electrode 208. When the circularly polarizer light again encounters the circular polarizer, the linear polarizer blocks any further transmission of the ambient light. Therefore, the optical component layers 226 minimize or prevent the reflection of ambient light by the display 100. The component layers of the circular polarizer may differ in other cases. For example, one or more half-wave retarders may be used instead of or in addition to a quarter-wave retarder.

Other optical functions may be provided. For example, in some cases, the display 200 (or the OLED panel 120 thereof) includes one or more optical component layers 226 configured to increase on-axis luminance. For instance, the optical component layers 226 may be configured to increase the optical power of the well or cavity 222. Additional or alternative optical functions may be provided by the optical component layer 226.

The arrangement of the optical component layers 226 may vary from the example shown. For example, one or more of the optical component layers 226 may be disposed between adjacent encapsulation layers 220 or between the OLED structures 204 and the encapsulation layer(s) 220. Alternatively or additionally, the optical component layer(s) may or may not be continuous or uniform across the OLED structures 204. As an example, one or more of the optical component layers may be patterned to implement the optical function(s) selectively on a sub-pixel-by-sub-pixel basis, on a pixel-by-pixel basis, or in any other selective manner. In some cases, one or more of the optical component layer(s) 226 are also directed to non-optical functions, including, for instance, encapsulation. Fewer, alternative, or additional optical component layers may be provided.

The display 200 includes a filter film 228 as a further optical component layer. The filter film 228 may correspond with, or be configured to provide, the filter 118 of FIG. 1. In this case, the film 228 is discrete from the layers of the OLED panel 120. The film 228 is disposed outward or forward of the encapsulation layers 220. The filter film 228 is disposed inward or rearward of the circular polarizer of the optical component layer 226. With such inward positioning, light reflected backward by the filter film 228 for recycling is not circularly polarized. In the example of FIG. 2, the optical component layer 226 and the filter film 228 are contiguous with one another. Other arrangements may be used, including, for instance, arrangements in which the filter film 228 is spaced from the optical component layer 226 and/or other optical component layers.

The film 228 may include one or more Bragg gratings. Each Bragg grating is configured to reflect the portion of the light having the respective wavelength and propagating at the respective off-axis angle, as described herein. In some cases, the film 228 is or includes a holographic film, such as the above-referenced Bayfol HX film. The Bragg or other interference grating(s) are recorded in the holographic film. Other photopolymer films or layers may be used. Other types of interference filters may be recorded. The film 228 may thus be configured as an interference grating film.

As depicted in FIG. 2, the filter film 228 is or includes a planar layer. However, the filter film 228 and other components of the display 200 may be flexible. For instance, the substrate 202 may be composed of, or otherwise include, a plastic material. The substrate 202 and other layers or elements of the display 200, including the filter film 228, may be curved.

An optically clear adhesive (OCA) layer 230 may be used to adhere the optical component layers 226, 228 to the OLED panel 120. In this example, the OCA layer 230 adheres the filter film 228 to the topmost encapsulation layer 220. The OCA layer 230 may include acrylate based materials, rubbers, silicones, polyolefins, hot melt adhesives, thermoplastic polymers, or curable adhesives, but any one or more materials may be used to form the OCA layer 230. The OCA layer 230 may be or include a film that planarizes the surface to which the optical component layers 226, 228 are attached. In the example of FIG. 2, the encapsulation layers 220 are conformal and, consequently, retain the contour of the OLED structures 204. The OCA layer 230 may be spun onto, or otherwise coat, the encapsulation stack to fill in depressions between the OLED structures 204. In other cases, one or more planarization layers may be provided in addition to the layer(s) providing adhesion.

In some cases, the optical component layers 226, 228 are deposited or otherwise formed on another substrate (e.g., a carrying wafer) before transfer to the backplane or substrate 102. The optical component layers 226, 228 are separated from the other substrate during fabrication due to the adhesion strength of the OCA layer 230 being greater than the strength of the attachment to the other substrate.

In the example of FIG. 2, the display 200 includes a transparent cover 232 that forms a front surface, or top face, of the display 200. The transparent cover 232 may be flexible to allow bending of the display 200. The transparent cover 232 may be composed of, or include, one or more transparent materials to allow transmission of light generated by the OLED structures 204. For example, the transparent cover 232 may include or be composed of a clear polymer film, such as hard-coated polymers (e.g., polycarbonates, PET, PEN, TAC, PMMA, and others). The transparent cover 232 may be attached to the other components of the display 200 via an adhesive layer. In this example, another OCA layer 234 is used. Alternatively or additionally, an adhesive material is provided to secure the transparent cover 232 along a periphery of the display 200. For example, the transparent cover 232 may be attached to a bezel, frame, or other structural component of the display 200 along the periphery.

The display 200 may include additional, fewer, or alternative layers involved in the fabrication of the OLED structures 204. For instance, the OLED panel 120 (or, more generally, the display 200) may include one or more planarization layers. In the example of FIG. 2, a planarization layer 236 is disposed between the transistors 216 of the TFT circuitry 214 and the layer occupied by the lower electrode 208 of the OLED structures 204. The planarization layer 236 establishes a flat surface (or relatively or sufficiently flat) for fabrication of the organic layer stack 212 and/or other light generating components of the OLED structures 204. The planarization layer 236 may include one or more dielectric materials, such as silicon nitride or a curable resin. The planarization layer 236 may be patterned to support the formation of the via interconnects 218 and/or other metal layers or other components of the TFT circuitry 214. Still further additional or alternative layers may be included in the OLED panel 120, including, for instance, one or more thermal normalization layers.

The display 200 may include additional, fewer, or alternative layers outside of the OLED panel 120. For example, one or more stress-relieving films or other layers may be disposed between the OLED panel 120 and the cover 232.

Figure 3:
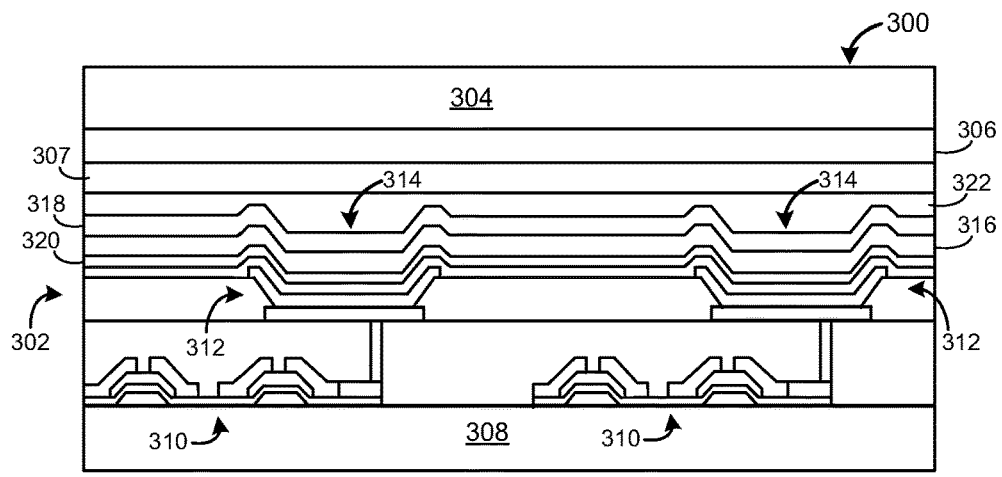
FIG. 3 is a partial, schematic, cross-sectional view of an OLED display having an internal filter for color compensation in accordance with one example.

FIG. 3 depicts a display 300 having color compensation in accordance with another example. The display 300 may be configured similarly to the display 200 of FIG. 2 in several respects. For instance, the display 300 may have an OLED panel 302, a transparent cover 304, and a number of optical, stress-relief, or thermal layers 306, 307 disposed between the OLED panel 302 and the transparent cover 304. The OLED panel 302 also similarly includes a substrate 308 and TFT circuitry 310 and an array of OLED structures 312 supported by the substrate 308. Each OLED structure 312 has a well 314 that leads to the color shift addressed herein.

The example of FIG. 3 differs from the above-described examples in connection with the location and configuration of the filter used to compensate for the color shift. In this case, a filter layer 316 of the display 300 is integrated with the other layers of the OLED panel 302. The filter layer 316 is an internal component of the OLED panel 302, rather than a discrete film disposed thereon. The filter layer 316 may be disposed within, or inward of, a moisture barrier established by a number of encapsulation layers 318, 320 of the OLED panel 302. In the example of FIG. 3, the filter layer 316 is contiguous with, or otherwise adjacent to, a number of encapsulation layers 318, 320. For example, the filter layer 316 may be disposed in between the encapsulation layers 318, 320.

The filter layer 316 is non-planar. In this case, the filter layer 316 conforms to the contour of the wells 314 of the OLED structures 312 and/or the encapsulation layers 318, 320. The filter layer 316 is nonetheless configured to reflect a portion of the light having a respective wavelength and propagating at a respective off-axis angle back toward the OLED structures 312 to reduce an amount of the light having the predetermined wavelength transmitted through the cover 304 at the off-axis angle. The filter layer 316 may include one or more Bragg or other interference gratings to that end.

The encapsulation layers 318, 320 may be configured as described above. For example, the encapsulation layers 318, 320 extend across the array of OLED structures 312 the encapsulation layer 318 may be composed of, or otherwise include, silicon dioxide. The encapsulation layer 320 may be composed of, or otherwise include, a polymer or other organic material. Additional, alternative, or fewer encapsulation layers may be provided.

The internal location of the filter layer 316 may differ from the example of FIG. 3. For instance, the filter layer 316 may be disposed outside of the moisture barrier. In one example, the filter layer 316 is disposed between the encapsulation layer 320 and an adhesive or planarization layer 322. Alternatively, the filter layer 316 may be disposed on (e.g., adhered to) the adhesive or planarization layer 322. The filter layer 316 may nonetheless be considered to be a constituent element of the OLED panel 302 in such cases.

Figure 4:
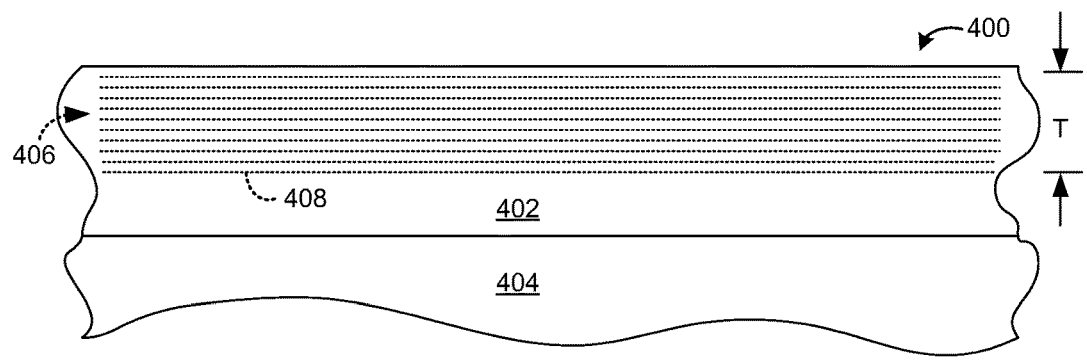
FIG. 4 is a partial, schematic, side view of a filter having a deep grating with planar grating structures for color compensation in accordance with one example.
Figure 5:
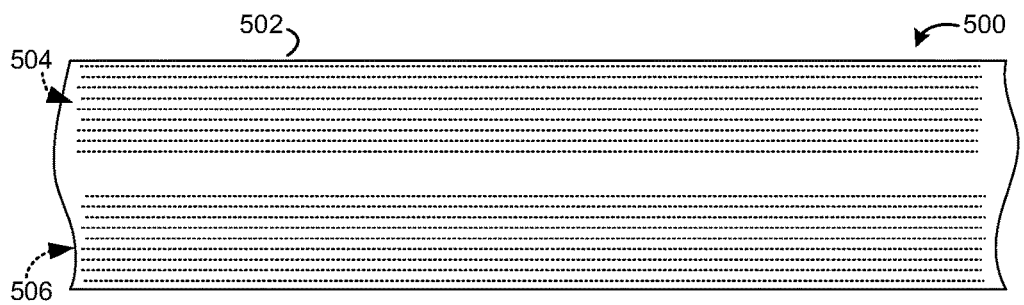
FIG. 5 is a partial, schematic, side view of a filter having multiple interference gratings for color compensation of multiple wavelengths in accordance with one example.
Figure 6:
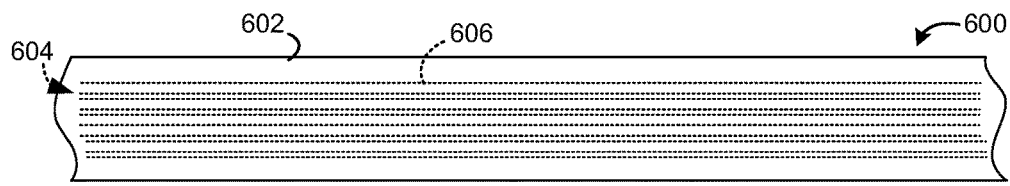
FIG. 6 is a partial, schematic, side view of a filter having an interference grating with non-periodic grating structures in accordance with one example.

FIGS. 4-6 depict several examples of filters schematically. Dashed lines are used to schematically represent index variations within a film in which the grating(s) is/are formed. In some cases, the index variations are recorded holographically. In such cases, the grating structures constitute a superposition of regions of varying refractive index. The dashed lines are simplified representations of the regions, insofar as holographic gratings are not localized in depth.

FIG. 4 depicts a filter 400 in accordance with a film-based example. In this case, the filter 400 includes a photopolymer layer 402 supported by a substrate 404. Both the photopolymer layer 402 and the substrate 404 may be flexible. In one example, the substrate 404 has a thickness of about 50 microns, and the photopolymer layer 402 has a thickness of about 15 microns. Other thicknesses may be used.

The filter 400 includes a grating 406 in the photopolymer layer 402. The grating 406 is schematically depicted by a series of dotted lines. The dotted lines may be indicative of planar regions 408 of differing (e.g., higher or lower) refractive index than regions between or adjacent the planar regions 408. In this example, the planar regions 408 are periodically spaced from one another over a thickness T of the grating 406. In other cases, the planar regions 408 are non-periodically spaced from one another.

The depth of the grating 406 refers to the period of the planes of the grating relative to the overall thickness of the grating. An optically deep grating is one having a period of about one-tenth or less the total thickness of the grating. In gratings with non- or semi-periodic structures, the average period may be used.

The grating 406 may or may not be a deep grating. The grating 406 may be considered a deep grating if the period of the planar regions 408 is at about one-tenth or less the thickness T. The thickness T of the grating 406 may vary. The thickness T of the grating 402 may be adjusted to establish the breadth of the range of angles and/or the bandwidth reflected by the filter 400. The breadth of the angular range and/or the bandwidth may thus be customized or otherwise selected. The number, respective thickness, refractive index, and other characteristics of the planar regions 408 may be lower or higher than the example shown.

Recording of the structures 408 may include temporarily bonding the holographic film or layer, such as Bayfol HX, to a surface mirror. The film may then be exposed using a source light, such as an LED or laser, through a collimating lens. The film is removed from the mirror for use. The offset angle for the resulting filter may be selected by adjusting the angle of the mirror relative to the beam of the light source.

The reflection wavelength of the resulting filter is determined by the spectrum of the source light. The thickness of the grating is controlled by the bandwidth of the source light, rather than other source light parameters, such as intensity. For instance, a laser may be used to create a narrower bandwidth of the reflection wavelength. An LED may be used to create a broader reflection bandwidth. The LED-written grating is weaker and wider, resulting in lower peak reflection and more gentle color compensation. In contrast, the laser-written grating is stronger and narrower, resulting in higher peak reflection and more focused color compensation.

FIG. 5 depicts an example of a filter 500 having multiple gratings. The filter 500 includes a film or layer 502. The film 502 may or may not include a substrate. In this example, the film 502 includes two interference gratings 504, 506. Each grating 504, 506 may be considered a respective filter. The multiplicity of filters may be used to reflect more than one wavelength (e.g., a single wavelength band and/or multiple, discrete wavelengths) and/or to address different off-axis angles for a given wavelength. For example, the filter 500 may be configured to address two wavelengths (or wavelength bands), such as blue light (e.g., about 460 nm) and green light (e.g., about 520 nm), over a range of off-axis angles, such as about 20 degrees to about 30 degrees.

Each grating 504, 506 includes a respective set of planes of alternating refractive index. In this example, the respective sets are spaced from one another as shown. In other cases, the respective sets may overlap one another. In some cases, the respective sets involve the same variance in refractive index. In other cases, the respective sets may present different variances in refractive index. The amount of reflection may thus vary between wavelengths and/or off-axis angles.

Multiple grating filters may be configured differently than the physically separated grating arrangement shown in FIG. 5. For instance, the multiple gratings may be disposed in a superposition arrangement.

FIG. 6 depicts an example of a filter 600 having a non-periodic grating arrangement. The filter 600 includes a film 602 in which a grating 604 is recorded or otherwise formed. In this case, the grating 604 includes regions 606 of alternating refractive index that are non-periodically arranged. In the non-periodic arrangement, the spacing between adjacent regions 606 is not constant.

The spacing may change in various ways. For instance, the spacing may change one or more times across the set. In other cases, the spacing may vary progressively. In still other cases, the spacing may alternate between two or more discrete spacing amounts. The manner in which the spacing or non-periodicity varies may be selected to establish one or more spectral and/or angular characteristic(s) of the filter response.

Figure 7:
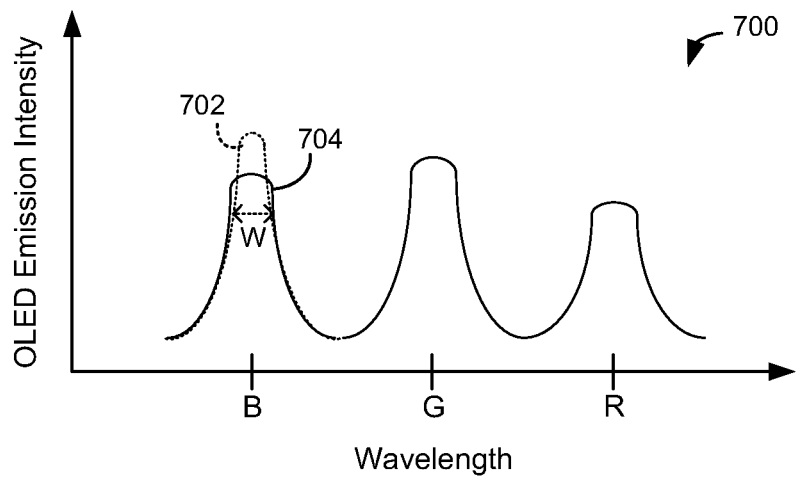
FIG. 7 is a graphical plot of OLED display output before and after color compensation as a function of wavelength in accordance with one example.

FIG. 7 is a graphical plot 700 of an example OLED panel emission spectrum to depict the manner in which the above-described filters provide color compensation in an angular- and wavelength-specific manner. In this example, the OLED panel generates light in multiple color bands, e.g., one for each display color—blue (B), green (G), and red (R). Without the color compensation, the OLED panel provides an emission spectrum 702 having an undesirably high level of blue light at a specific off-axis angle, such as 25 degrees. One or more Bragg gratings of the filter are tuned or configured to reflect light within a wavelength band W for certain off-axis angles (e.g., about 25 degrees plus/minus 5 degrees). A resulting emission spectrum 704 has a lower peak intensity in the wavelength band W. The lower peak intensity is indicative of light within the band W being directed at other off-axis angles.

In other examples, another Bragg grating or filter may be provided to similarly reduce the green light at the certain off-axis angle.

Figure 8:
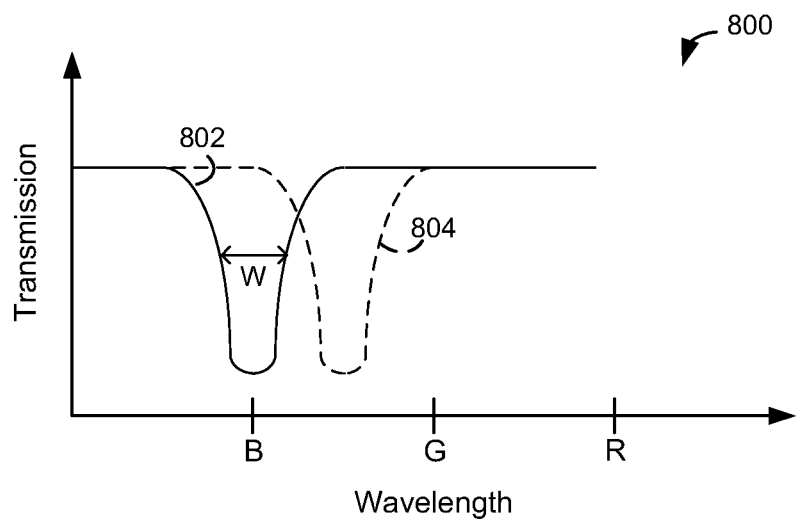
FIG. 8 is a graphical plot of filter transmission as a function of wavelength for a color compensation filter illuminated at two different angles in accordance with one example.

FIG. 8 is a graphical plot 800 that depicts a transmission curve of the example color compensation shown in FIG. 7. The filter has a transmission curve 802 with a notch at the respective wavelength for the certain off-axis angle, e.g., about 25 degrees. At another angle, one not of interest for color compensation purposes, the filter has a transmission curve 804 with a notch at a different wavelength. The notch has shifted to a wavelength outside of the three OLED emission bands. In the example of FIG. 8, the notch is disposed between the blue and green wavelength bands for on-axis light. The filter thus has no effect on the OLED panel at near axial emission angles. As the emission angle increases, the notch moves to shorter wavelengths. In this case, the filter notch is disposed at blue wavelengths for off-axis angles of about 30 degrees. The amount of blue light emitted at that off-axis angle is thereby reduced.

Described above are examples of OLED displays having filters configured to provide color compensation. The filters are interference notch filters. As the view angle changes, the center wavelength of the notch filter shifts. The filters may thus be configured to reflect increasing amounts of blue and/or green light at certain off-axis angles, but not affect red light at any emission angle. The filters are also tuned or configured such that on-axis luminance is not affected. Reflected light is recycled in the OLED layer or panel. For instance, the reflected light may be partly absorbed and partly scattered. The color compensation is thus achieved with modest to zero reduction in peak luminance, and without any loss of resolution. Ambient contrast (determined by a circular polarizer on the OLED) is also unaffected.

Figure 9:
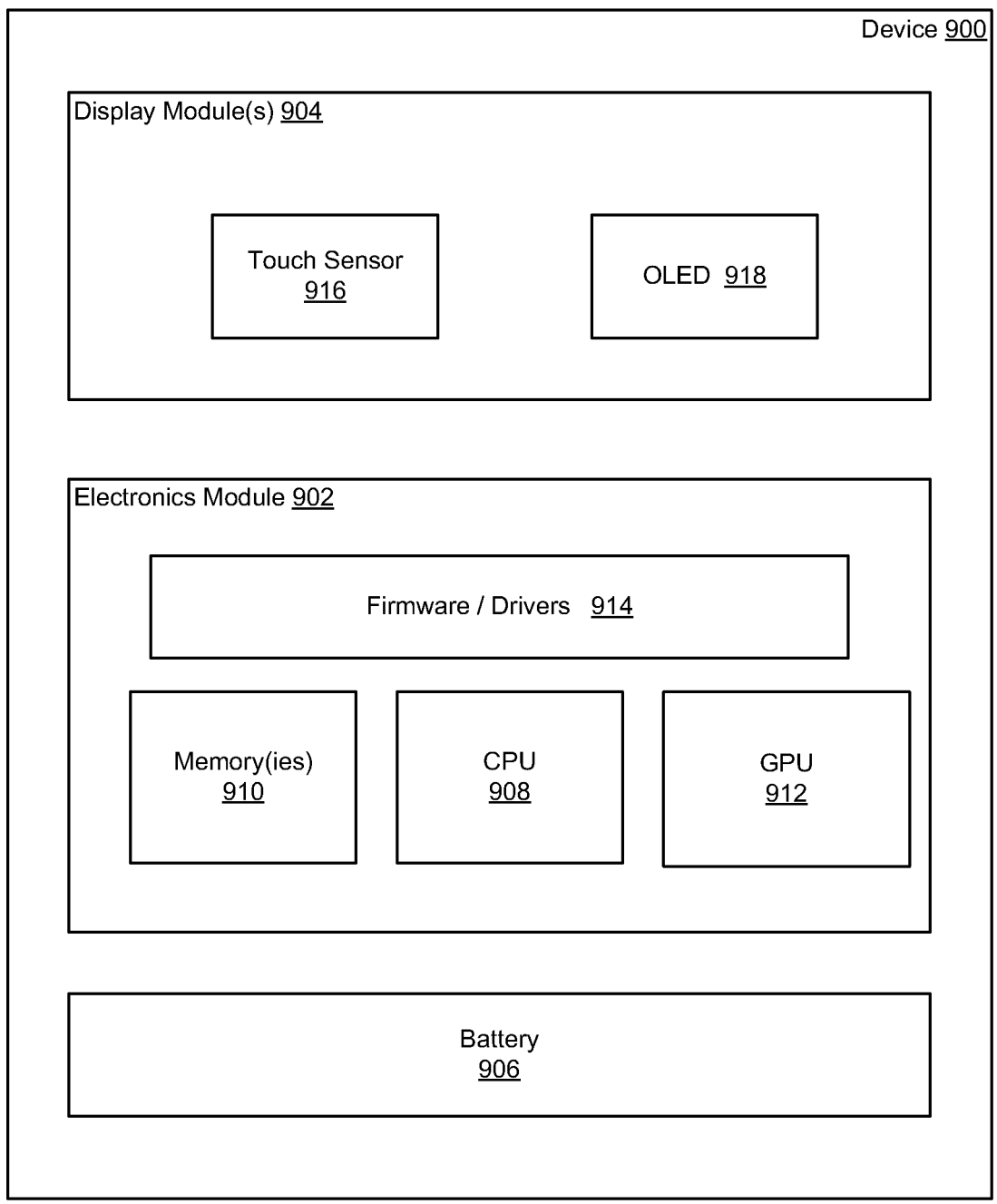
FIG. 9 is a block diagram of an electronic device having an OLED display with color compensation filtering in accordance with one example.

FIG. 9 shows an exemplary electronic device 900 with an electronics module 902 and a display module 904 (or subsystem), and a battery 906. The electronic device 900 may include additional, fewer, or alternative components. For example, the display module 904 may be integrated with the electronics module 902 and/or other components of the electronic device 900 to a varying extent. For instance, the electronics module 902 and/or the display module 904 may include a graphics subsystem of the electronic device 900. Any number of display modules or systems may be included. In this example, the device 900 includes a processor 908 and one or more memories 910 separate from the display module 904. The processor 908 and the memories 910 may be directed to executing one or more applications implemented by the device 900. The display module 904 generates a user interface for an operating environment (e.g., an application environment) supported by the processor 908 and the memories 910. The processor 908 may be a general-purpose processor, such as a central processing unit (CPU), or any other processor or processing unit. Any number of such processors or processing units may be included.

In the example of FIG. 9, the electronics module 902 includes a graphics processing unit (GPU) 912 and firmware and/or drivers 914. The GPU 912 may be dedicated to graphics- or display-related functionality and/or provide general processing functionality. Some of the components of the electronics module 902 may be integrated. For example, the processor 908, the one or more of the memories 910, the GPU 912, and/or the firmware 914 may be integrated as a system-on-a-chip (SoC) or application-specific integrated circuit (ASIC). The electronics module 902 may include additional, fewer, or alternative components. For example, the electronics module 902 may not include a dedicated graphics processor, and instead rely on the CPU 908 or other general-purpose processor to support the graphics-related functionality of the electronic device 900. The electronics module 902 may include additional memory (or memories) to support display-related processing.

In the example of FIG. 9, the display module 904 includes a touch sensor unit 916 and an OLED panel or unit 918. The touch sensor unit 916 and/or the OLED unit 918 may be configured in accordance with one of the examples described above to provide color compensation via interference grating-based filtering. The filtering may be provided by a filter integrated with, or external to, the OLED panel 918, as described above. Additional, fewer, or alternative display components may be provided. For example, in some cases, the display module 904 does not include a touch sensor unit.

The device 900 may be configured as one of a wide variety of computing devices, including, but not limited to, handheld or wearable computing devices (e.g., tablets and watches), communication devices (e.g., phones), laptop or other mobile computers, personal computers (PCs), and other devices. The device 900 may also be configured as an electronic display device, such as a computer monitor, a television, or other display or visual output device. In such cases, the device 900 may not include one or more of the above-described components, such as the battery 906.

In one aspect, a display includes a substrate, an array of organic light emitting diode (OLED) structures supported by the substrate, and a filter extending across the array of OLED structures, the filter being positioned relative to the array of OLED structures such that light emitted by each OLED structure of the array of OLED structures is directed toward the filter. The filter is configured to reflect a portion of the light having a respective wavelength and propagating at a respective off-axis angle back toward the array of OLED structures to reduce an amount of the light having the respective wavelength emitted by the display at the off-axis angle.

In another aspect, a display includes an organic light emitting diode (OLED) panel, a cover disposed across the OLED panel and positioned relative to the OLED panel such that light emitted from the OLED panel is directed toward the cover, and an interference grating film disposed between the OLED panel and the cover, the interference grating film extending across the OLED panel. The interference grating film is configured to reflect a portion of the light having a respective wavelength and propagating at a respective off-axis angle back toward the OLED panel to reduce an amount of the light having the predetermined wavelength transmitted through the cover at the off-axis angle.

In yet another aspect, a display includes an organic light emitting diode (OLED) panel and a filter film extending across the OLED panel and disposed relative to the OLED panel such that light emitted by the OLED panel is directed toward the filter film. The filter film includes a grating having a depth at least ten times thicker than a periodicity of the grating. The grating is configured to reflect a portion of the light having a respective wavelength and propagating at a respective off-axis angle back toward the OLED panel to reduce an amount of the light having the respective wavelength emitted by the display at the respective off-axis angle.

In connection with any one of the aforementioned aspects, the display may alternatively or additionally include any combination of one or more of the following aspects or features. The substrate and the array of OLED structures form an OLED panel. The filter includes a film discrete from the OLED panel. The film includes a Bragg grating, the Bragg grating being configured to reflect the portion of the light having the respective wavelength and propagating at the respective off-axis angle. The film includes a photopolymer layer. The filter includes a holographic film in which an interference grating is recorded. The interference grating is configured to reflect the portion of the light having the predetermined wavelength and propagating at the off-axis angle. The filter has a notch at the respective wavelength given the respective off-axis angle. The filter is configured such that the respective wavelength resides in a blue emission band of the array of OLED structures when the respective off-axis angle falls in a range from about 20 degrees to about 30 degrees. The filter is a first filter of a plurality of filters of the display. The plurality of filters include a second filter. The second filter is configured to reflect a further portion of the light propagating at the respective off-axis angle. The further portion of the light resides in an emission band of the array of OLED structures other than the blue emission band. The display further includes a plurality of encapsulation layers extending across the array of OLED structures to form a moisture barrier for the array of OLED structures. The filter is disposed within the moisture barrier. The filter includes a grating having a depth at least ten times thicker than a periodicity of the grating. The filter includes a grating. The grating includes a plurality of planes of alternating refractive index. The plurality of planes are oriented in parallel with the substrate of the display. The substrate includes a plastic material. The interference grating film includes a Bragg grating. The Bragg grating is configured to reflect the portion of the light having the respective wavelength and propagating at the respective off-axis angle. The interference grating film includes a photopolymer layer. The respective wavelength resides in a blue emission band of the OLED panel when the respective off-axis angle falls in a range from about 20 degrees to about 30 degrees. The filter film includes a holographic film. The grating includes a plurality of planes of alternating refractive index. The plurality of planes are oriented in parallel with the OLED panel. The respective wavelength resides in a blue emission band of the OLED panel when the respective off-axis angle falls in a range from about 20 degrees to about 30 degrees.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. A display comprising:
   a substrate;
   an array of organic light emitting diode (OLED) structures supported by the substrate; and
   a filter for color correction extending across the array of OLED structures, the filter being positioned relative to the array of OLED structures such that light emitted by each OLED structure of the array of OLED structures is directed toward the filter;
   wherein the filter is configured to reflect a first color of the light having a first wavelength and propagating at a first off-axis angle back toward the array of OLED structures and reflect a second color of the light having a second wavelength different from the first wavelength and propagating at a second off-axis angle back toward the array of OLED structures to reduce a first amount of the first color having the first wavelength emitted by the display at the first off-axis angle and a second amount of the second color having the second wavelength emitted by the display at the second off-axis angle.

2. The display of claim 1, wherein:
   the substrate and the array of OLED structures form an OLED panel; and
   the filter comprises a film discrete from the OLED panel.

3. The display of claim 2, wherein the film comprises a Bragg grating, the Bragg grating being configured to reflect the portion of the light having the respective wavelength and propagating at the respective off-axis angle.

4. The display of claim 2, wherein the film comprises a photopolymer layer.

5. The display of claim 1, wherein:
the filter comprises a holographic film in which an interference grating is recorded; and
the interference grating is configured to reflect the portion of the light having the predetermined wavelength and propagating at the off-axis angle.

6. The display of claim 1, wherein the filter has a notch at the respective wavelength given the respective off-axis angle.

7. The display of claim 1, wherein the filter is configured such that the respective wavelength resides in a blue emission band of the array of OLED structures when the respective off-axis angle falls in a range from about 20 degrees to about 30 degrees.

8. The display of claim 7, wherein:
the filter is a first filter of a plurality of filters of the display;
the plurality of filters comprise a second filter;
the second filter is configured to reflect a further portion of the light propagating at the respective off-axis angle; and
the further portion of the light resides in an emission band of the array of OLED structures other than the blue emission band.

9. The display of claim 1, further comprising a plurality of encapsulation layers extending across the array of OLED structures to form a moisture barrier for the array of OLED structures, wherein the filter is disposed within the moisture barrier.

10. The display of claim 1, wherein the filter comprises a grating having a depth at least ten times thicker than a periodicity of the grating.

11. The display of claim 1, wherein:
the filter comprises a grating;
the grating comprises a plurality of planes of alternating refractive index; and
the plurality of planes are oriented in parallel with the substrate of the display.

12. The display of claim 1, wherein the substrate comprises a plastic material.

13. A display comprising:
an array of organic light emitting diode (OLED) structures;
a cover disposed across the OLED panel and positioned relative to the OLED panel such that light emitted from the OLED panel is directed toward the cover; and
an interference grating film disposed between the array of OLED structures and the cover, the interference grating film extending across the OLED panel;
wherein the interference grating film is configured to reflect a first color of the light having a first wavelength and propagating at a first off-axis angle back toward the array of OLED structures and reflect a second color of the light having a second wavelength different from the first wavelength and propagating at a second off-axis angle back toward the array of OLED structures to reduce a first amount of the first color having the first wavelength emitted by the display at the first off-axis angle and a second amount of the second color having the second wavelength emitted by the display at the second off-axis angle.

14. The display of claim 13, wherein the interference grating film comprises a Bragg grating, the Bragg grating being configured to reflect the portion of the light having the respective wavelength and propagating at the respective off-axis angle.

15. The display of claim 13, wherein the interference grating film comprises a photopolymer layer.

16. The display of claim 13, wherein the respective wavelength resides in a blue emission band of the array of OLED structures when the respective off-axis angle falls in a range from about 20 degrees to about 30 degrees.

17. A display comprising:
an array of organic light emitting diode (OLED) structures; and
a filter film extending across the array of OLED structures and disposed relative to the array of OLED structures such that light emitted by the array of OLED structures is directed toward the filter film;
wherein the filter film comprises a grating having a depth at least ten times thicker than a periodicity of the grating, and
wherein the grating is configured to reflect a first color of the light having a first wavelength and propagating at a first off-axis angle back toward the array of OLED structures and reflect a second color of the light having a second wavelength different from the first wavelength and propagating at a second off-axis angle back toward the array of OLED structures to reduce a first amount of the first color having the first wavelength emitted by the display at the first off-axis angle and a second amount of the second color having the second wavelength emitted by the display at the second off-axis angle.

18. The display of claim 17, wherein the filter film comprises a holographic film.

19. The display of claim 17, wherein:
the grating comprises a plurality of planes of alternating refractive index; and
the plurality of planes are oriented in parallel with the array of OLED structures.

20. The display of claim 17, wherein the respective wavelength resides in a blue emission band of the array of OLED structures when the respective off-axis angle falls in a range from about 20 degrees to about 30 degrees.

* * * * *